United States Patent
Sudo et al.

(10) Patent No.: US 9,758,901 B2
(45) Date of Patent: Sep. 12, 2017

(54) VITREOUS SILICA CRUCIBLE FOR PULLING OF SILICON SINGLE CRYSTAL AND METHOD FOR MANUFACTURING THE SAME

(71) Applicant: SUMCO CORPORATION, Minato-ku, Tokyo (JP)

(72) Inventors: Toshiaki Sudo, Akita (JP); Ken Kitahara, Akita (JP); Akihiro Aiba, Akita (JP); Kazushi Ousyuya, Akita (JP); Fumie Yoshida, Akita (JP); Makiko Hinooka, Akita (JP); Eriko Kitahara, Akita (JP); Tadahiro Sato, Akita (JP)

(73) Assignee: SUMCO CORPORATION, Tokyo (JP)

( * ) Notice: Subject to any disclaimer, the term of this patent is extended or adjusted under 35 U.S.C. 154(b) by 10 days.

(21) Appl. No.: 14/894,328

(22) PCT Filed: May 31, 2013

(86) PCT No.: PCT/JP2013/065294
§ 371 (c)(1),
(2) Date: Nov. 25, 2015

(87) PCT Pub. No.: WO2014/192163
PCT Pub. Date: Dec. 4, 2014

(65) Prior Publication Data
US 2016/0108550 A1    Apr. 21, 2016

(51) Int. Cl.
*C30B 15/10* (2006.01)
*C03B 19/09* (2006.01)
(Continued)

(52) U.S. Cl.
CPC ............ *C30B 15/10* (2013.01); *C03B 19/095* (2013.01); *C30B 29/06* (2013.01); *C30B 35/002* (2013.01); *Y02P 40/57* (2015.11)

(58) Field of Classification Search
CPC .......... C30B 15/00; C30B 15/10; C30B 11/00; C30B 11/002; C30B 13/00; C30B 13/14;
(Continued)

(56) References Cited

U.S. PATENT DOCUMENTS

2012/0137965 A1* 6/2012 Sudo .................... C03B 19/095
117/208

FOREIGN PATENT DOCUMENTS

| JP | 10203893 A | 8/1998 |
|---|---|---|
| JP | 2000247778 A | 9/2000 |

(Continued)

OTHER PUBLICATIONS

International Search Report (ISR) mailed Jul. 23, 2013, issued for International application No. PCT/JP2013/065294.

*Primary Examiner* — Kenneth A Bratland, Jr.
(74) *Attorney, Agent, or Firm* — Law Office of Katsuhiro Arai

(57) ABSTRACT

The present invention provides a vitreous silica crucible which inhibits a deformation even when used under a high temperature condition for a long time, and a method for manufacturing the same. The vitreous silica crucible comprises: a substantially cylindrical straight body portion having an opening on the top end and extending in a vertical direction, a curved bottom portion, and a corner portion connecting the straight body portion with the bottom portion and a curvature of which is greater than that of the bottom portion, wherein, the vitreous silica crucible comprises a transparent layer on the inside and a bubble layer on the outside thereof, a compressive stress layer in which compressive stress remains in the inner surface side of the transparent layer, and a tensile stress layer in which tensile stress remains and is adjacent to the compressive stress layer at a gradual rate of change of stress.

7 Claims, 6 Drawing Sheets

(51) Int. Cl.
*C30B 29/06* (2006.01)
*C30B 35/00* (2006.01)

(58) Field of Classification Search
CPC ......... C30B 29/00; C30B 29/02; C30B 29/06;
C30B 35/00; C30B 35/002; C03B 19/095;
Y02P 40/57; Y10T 117/00; Y10T 117/10;
Y10T 117/1024; Y10T 117/1032; F27B
14/00; F27B 14/08; F27B 14/10; F27B
14/102; F27B 14/104
USPC .... 117/11, 13, 200, 206, 208, 928, 931–932
See application file for complete search history.

(56) References Cited

FOREIGN PATENT DOCUMENTS

| | | | |
|---|---|---|---|
| JP | 2012116702 A | 6/2012 | |
| JP | 2013095652 A | 5/2013 | |
| JP | 2013112597 A | 6/2013 | |
| WO | 2011013695 A1 | 2/2011 | |
| WO | WO 2011/013695 A1 * | 2/2011 | |

* cited by examiner

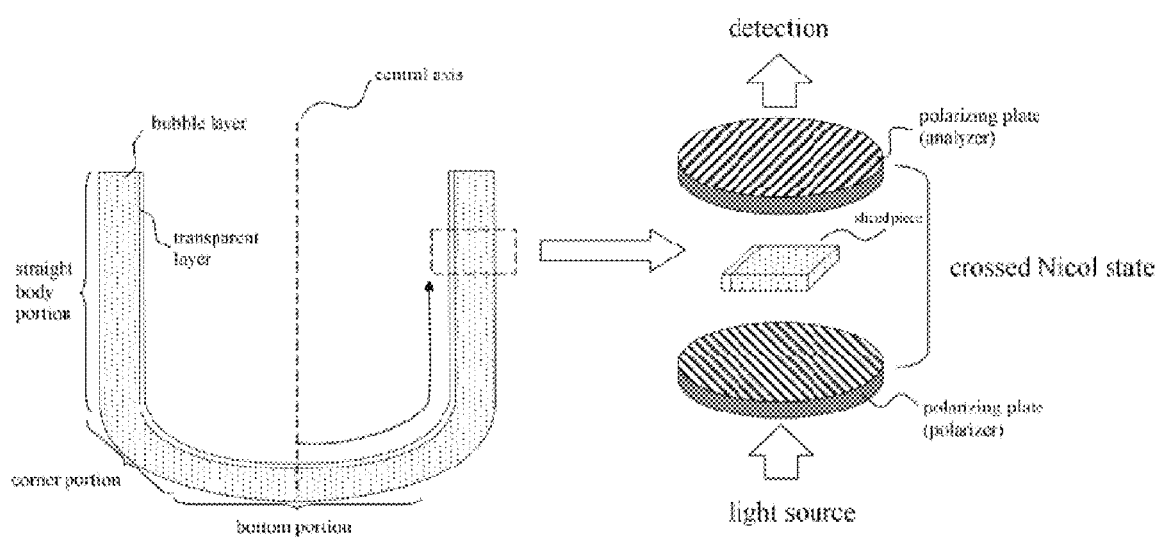
[Fig. 1]

[Fig. 2]
appearance
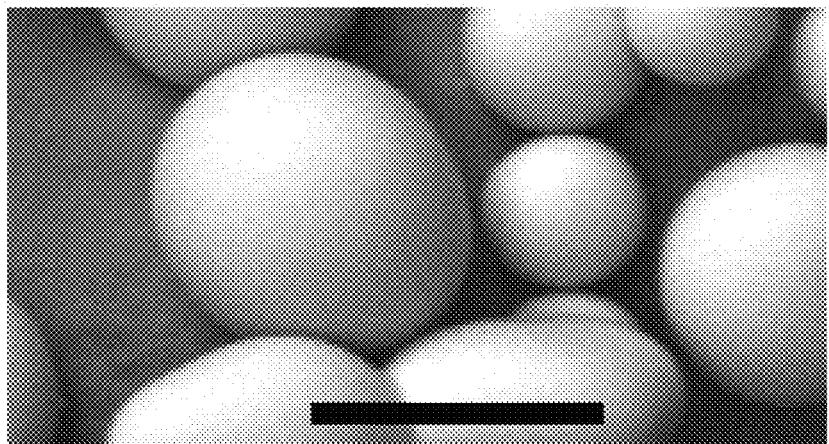
100 μm
cross section
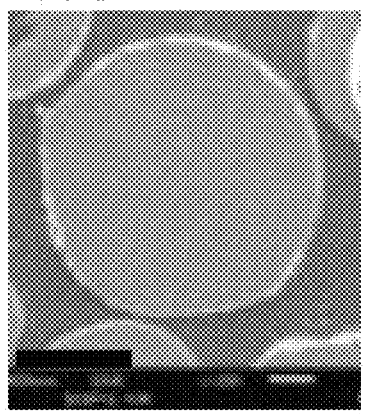 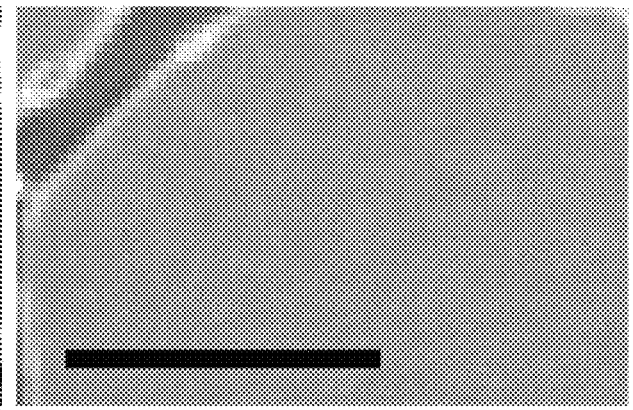
20 μm    20 μm

[Fig. 3]
appearance
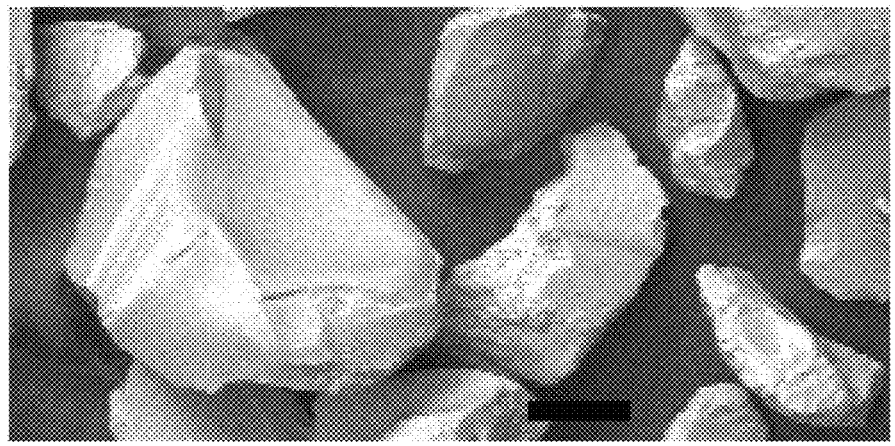
100 μm
cross section
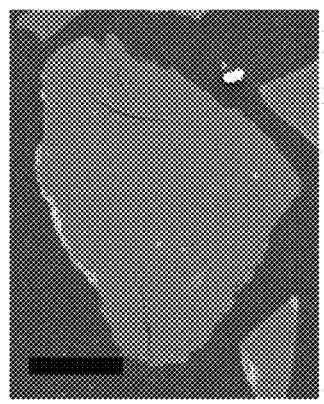 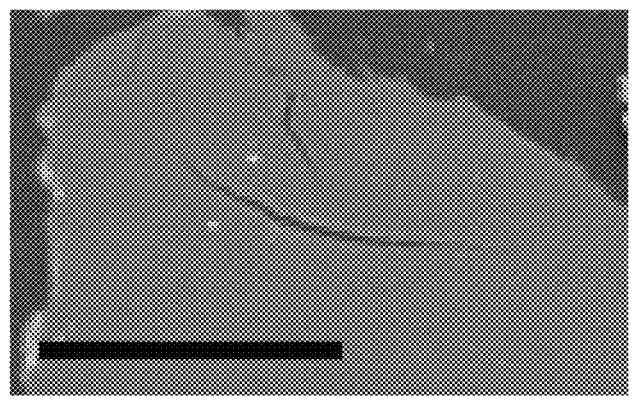
90 μm  90 μm

[Fig. 4]
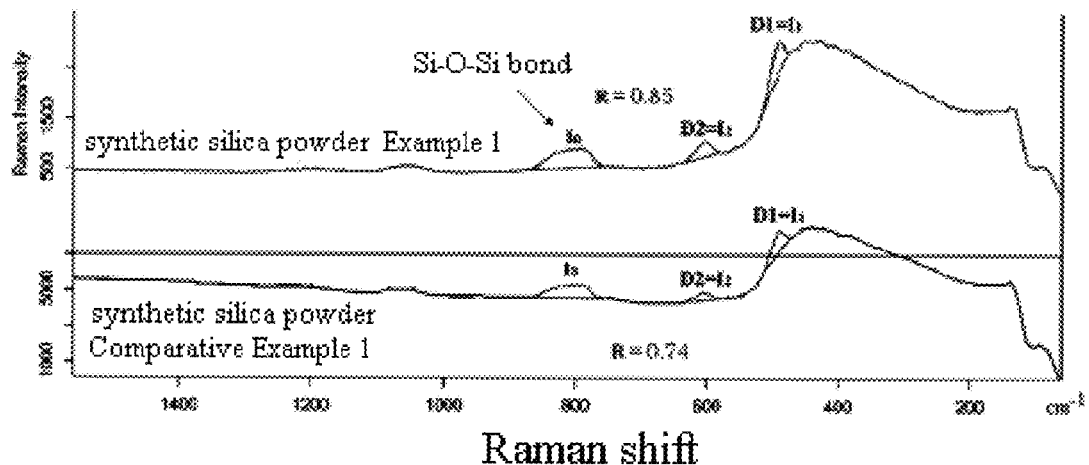
[Fig. 5]
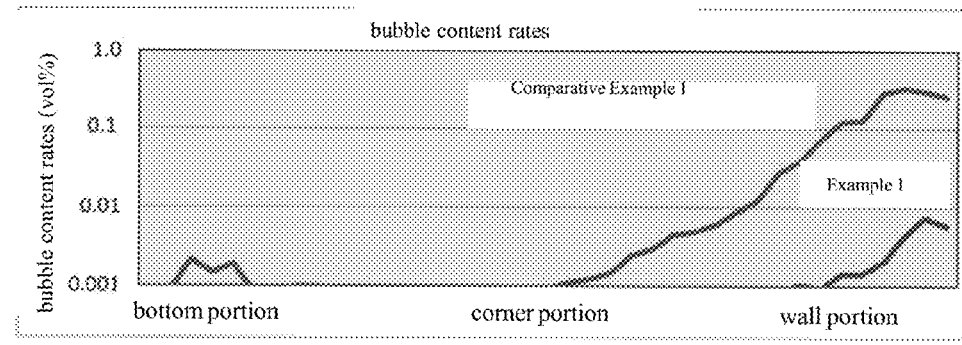
[Fig. 6]
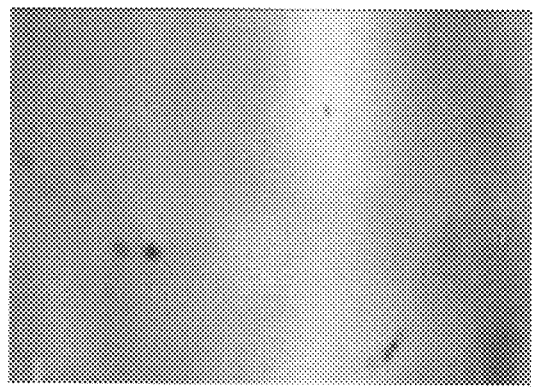

[Fig. 7]
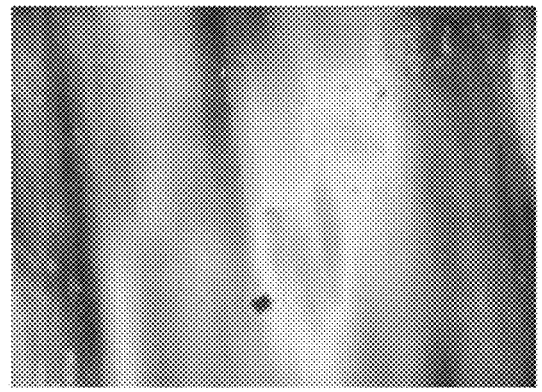
[Fig. 8]
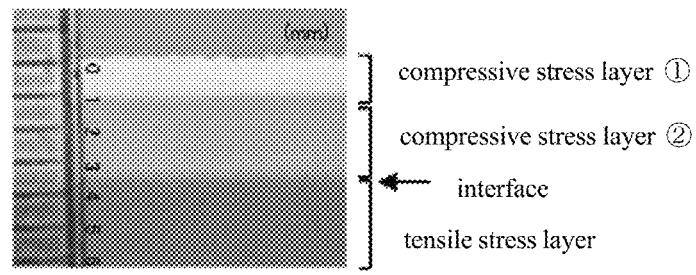
[Fig. 9]
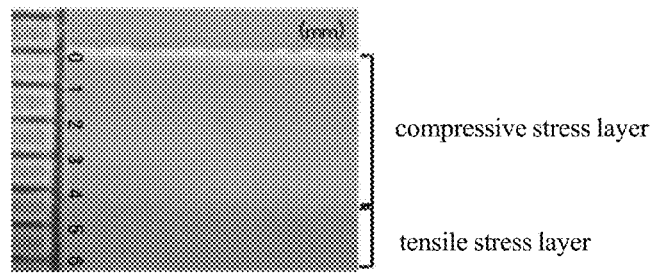

[Fig. 10]
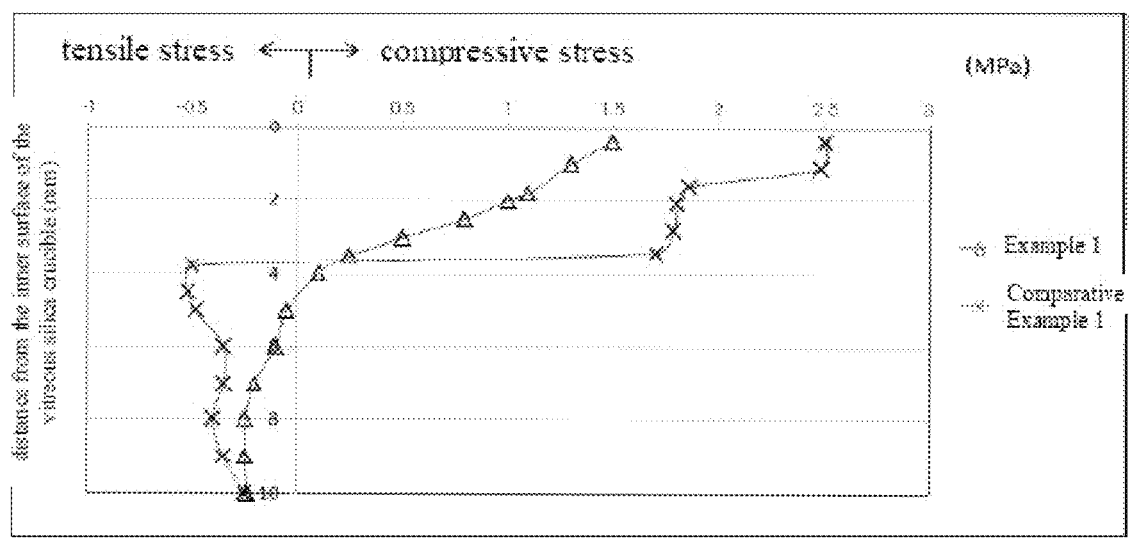

VITREOUS SILICA CRUCIBLE FOR PULLING OF SILICON SINGLE CRYSTAL AND METHOD FOR MANUFACTURING THE SAME

This application is the U.S. National Phase under 35 U.S.C. §371 of International Application PCT/JP2013/065294, filed May 31, 2013. The International Application was published under PCT Article 21(2) in a language other than English.

TECHNICAL FIELD

The present invention relates to a vitreous silica crucible for pulling of silicon single crystal serving as semiconductor material.

BACKGROUND ART

Silicon single crystal serving as semiconductor material is manufactured by the following process: heating polysilicon in a vitreous silica crucible with an external carbon heater to a temperature of about 1450-1600 deg. C., and then, pulling, recently according to the Czochralski method (CZ method) under depressurization. Price reduction of flash memory and DRAM is progressing rapidly, and for the purpose of responding to the demand, a diameter of silicon single crystal is shifting from the currently predominant 300 mmΦ to a large size of 400-450 mmΦ. Accordingly, in order to enable the manufacture of a silicon single crystal with large diameter, the inner diameter of vitreous silica crucible is also shifting from about 600 mm to a large opening diameter size of 700 mm or more. As the opening diameter of vitreous silica crucible increases, a distance from the heater disposed outside of the vitreous silica crucible to the center of the silicon single crystal increases. For example, when the opening diameter shifts from about 600 mm to 700 mm, the distance from the heater to the center of the single crystal increases 50 mm or more. Moreover, the amount of silicon melt of about 1420 deg. C. also increases as the opening diameter of vitreous silica crucible increases. For example, a crucible with a diameter of about 1000 mm is a vitreous silica container having a weight of about 120 kg, and the mass of silicon melt contained therein is 900 kg or more. That is, during the pulling of silicon single crystal, 900 kg or more silicon melt of about 1420 deg. C. is contained in the crucible.

The increase in the distance from the heater to the center of the silicon single crystal, and the increase in the amount of the polysilicon melt at a carbon heater temperature of about 1450-1600 deg. C., cause the temperature in the vitreous silica crucible to become higher and the time of pulling to become longer. For example, with respect to the softening temperature of a vitreous silica in a range of 1200-1300 deg. C., the temperature of the pulling of silicon single crystal is about 1420 deg. C., and thus the pulling of single crystal is conducted at an extremely high temperature above the softening temperature of the vitreous silica. The vitreous silica crucible is supported by a carbon susceptor. The vitreous silica crucible will have occurrence of deformation such as buckling or inward sagging by its own weight if the carbon susceptor does not exist. Moreover, the pulling time may be as long as 2 weeks or more. Under such an environment of high temperature for a long period, a problem that the vitreous silica crucible deforms or the like will occur. Usually, a vitreous silica crucible is disposed of after one time of CZ single crystal pulling.

In Patent Literature 1, a high-strength vitreous silica crucible is disclosed as follows: the crucible has a crystallized vitreous silica layer formed on the inner surface and the outer surface thereof, and the high-temperature resistance of the crucible is strengthened, thus no deformation occurs during a lengthy silicon single crystal pulling.

In Patent Literature 2, a vitreous silica crucible is disclosed as follows: the crucible contains Al as a crystallization promoter so that the concentration decreases from the outer surface to the inner surface thereof, thus Al contamination of the single crystal is prevented while a deformation of the crucible at high temperature is inhibited.

BACKGROUND ART LITERATURE

Patent Literature

Patent Literature 1: Japanese Patent Application Laid-Open Hei 10-203893
Patent Literature 2: Japanese Patent Application Laid-Open 2000-247778

SUMMARY OF THE INVENTION

Problems to be Solved by the Invention

However, in the method described in Patent Literature 1, since the crystallized vitreous silica layer is difficult to form uniformly, during CZ single crystal pulling, the crystallinity and the thickness of the crystallized vitreous silica layer become nonuniform, and uneven stresses occur in the crucible. As a result, during the pulling of silicon single crystal, the shape of the crucible experiences buckling or an inward sagging. Especially, in a large-size vitreous silica crucible, it takes a lot of time to form a crystallized vitreous silica layer, and it is difficult to form a uniform layer. Moreover, the formation of a crystallized vitreous silica layer has a problem of increasing manufacture time and cost due to being conducted after the manufacture of the crucible.

In the crucible of Patent Literature 2, only the durability of the outer surface side of the crucible improves; the durability of the inner surface side of the crucible does not improve, thus in the lengthy pulling of silicon single crystal a buckling or an inward sagging occurs in the inner surface side of the crucible. Moreover, although the Al in the inner surface side of the crucible is low in concentration, it is difficult to substantially prevent the silicon single crystal from being contaminated.

Therefore, in the reinforced vitreous silica crucible of prior arts, it is difficult to inhibit a buckling or inward sagging of a vitreous silica crucible during the pulling of silicon single crystal, and is difficult to prevent the yield of silicon single crystal from decreasing. Conventionally, the interface of the residual compressive stress or tensile stress of the inner surface is clear, and a structural arrangement of the internal residual stress during the CZ single crystal pulling is not considered.

The present invention has been made in consideration of such a situation and an object of the present invention is to provide a vitreous silica crucible used even under a condition of high temperature for a long time, and deformation of buckling or inward sagging is inhibited, and to provide a method for manufacturing the same.

Means for Solving the Problems

In order to achieve the above object, the present inventors carried out extensive research, and discovered that, by providing a transparent layer on the inside and a bubble layer on the outside of the transparent layer, and by changing gradually the residual stress in the transparent layer from compressive stress to tensile stress from the inside to the outside, deformation can be inhibited even when a vitreous silica crucible is used under a high temperature condition for a long time. That is, the present invention provides a vitreous silica crucible for pulling of silicon single crystal, comprising: a substantially cylindrical straight body portion having an opening on the top end and extending in a vertical direction, a curved bottom portion, and a corner portion connecting the straight body portion with the bottom portion and a curvature of which is greater than that of the bottom portion, wherein the vitreous silica crucible comprises a transparent layer on the inside and a bubble layer on the outside thereof, a compressive stress layer in which compressive stress remains in the inner surface side of the transparent layer, and a tensile stress layer in which tensile stress remains and is connected to the compressive stress layer with a moderate change of stress at the interface.

The present inventors studied a reinforced vitreous silica crucible avoiding the problems in Patent Literature 1 and Patent Literature 2, by, instead of crystallizing the vitreous silica during CZ single crystal pulling of a vitreous silica crucible, changing the structure of synthetic silica powder as raw material for manufacturing a vitreous silica crucible. As a result, it is revealed that compressive stress and tensile stress remain especially in the transparent layer of a vitreous silica crucible manufactured by using synthetic silica powder with specified Si—O—Si bonding (siloxane bonding) and average particle diameter. Further, it is revealed that when the synthetic silica powder is observed by using Raman shift in a specified range, tensile stress is adjacent to compressive stress at a gradual rate of change of stress. Furthermore, a vitreous silica crucible having compressive and tensile stress in the transparent layer cannot be observed to have a buckling or an inward sagging during the pulling of silicon single crystal. There is no report so far on a vitreous silica crucible having compressive stress and tensile stress remaining in the transparent layer with gradual transitioning; also there is no report or teaching so far on this effect.

Because the vitreous silica crucible is manufactured by depositing and fusing the synthetic silica powder in a rotatable carbon mold (rotating mold method) and the silica powder is fused uniformly, even in a large-size crucible, stress distribution of the transparent layer is uniform, and uneven stress does not occur. Therefore, the vitreous silica crucible according to the present invention is unlike the vitreous silica crucible described in Patent Literature 1 and is strengthened uniformly. Further, it is capable of preventing the silicon single crystal from being contaminated by a promoter according to the present invention, because no crystallization promoter is used as in Patent Literature 2.

Moreover, the present invention provides a method for manufacturing the silica glass crucible for pulling a silicon single crystal, comprising: a process of supplying natural silica powder to a rotating mold for manufacturing vitreous silica crucible and forming a layer of the natural silica powder on the inner surface of the rotating mold for manufacturing vitreous silica crucible, a process of depositing synthetic silica powder which satisfies following Formula (1) determined by Raman measurement method on the inside of the layer of the natural silica powder, and a process of arc discharging in the natural silica powder and the synthetic silica powder.

$$0.8 \leq R \leq 1.0 \quad (1)$$

in Formula (1), intensity ratio $R=(I_1+I_2)/I_0$ $I_1$=peak intensity of Raman shift 492 cm$^{-1}$ band
$I_2$=peak intensity of Raman shift 606 cm$^{-1}$ band
$I_0$=peak intensity of Raman shift 800 cm$^{-1}$ band According to the method for manufacturing a vitreous silica crucible of the present invention, it is possible to reduce the manufacturing time and cost since the strengthening treatment after the manufacture of a crucible is not required as described in Patent Literature 1. Further, it is possible to manufacture a vitreous silica crucible having durability under high temperature condition for a long time without using a crystallization promoter described in Patent Literature 2. Thus, so far it is not reported that a vitreous silica crucible having compressive stress and tensile stress adjacent to each other at a gradual rate of change of stress in a transparent layer can be manufactured by setting the range of the intensity ratio of the synthetic silica powder before melting.

Effects of the Invention

As described above, according to the present invention, it is possible to provide a vitreous silica crucible without deformation of buckling or inward sagging even when used under a high temperature condition for a long time, and a method for manufacturing the same.

BRIEF DESCRIPTION OF THE DRAWINGS

FIG. 1 is a cross-sectional view of a vitreous silica crucible, and a schematic diagram depicting a strain observation method.

FIG. 2 is electron microscope photos of the external appearance and cross sections of a plasma-treated synthetic silica powder of Manufacture Example 1.

FIG. 3 is electron microscope photos of the external appearance and cross sections of synthetic silica powder without plasma treatment of Comparative Manufacture Example 1.

FIG. 4 is Raman spectra of the plasma-treated synthetic silica powder of Manufacture Example 1.

FIG. 5 is a plot graph of the bubble content rates in respective parts of a vitreous silica crucible in Example 1 using the plasma-treated synthetic silica powder, and a vitreous silica crucible in Comparative Example 1 using the synthetic silica powder without plasma treatment.

FIG. 6 is a laser confocal microscope photo of the inner surface of the vitreous silica crucible in Example 1 using the plasma-treated synthetic silica powder.

FIG. 7 is a laser confocal microscope photo of the inner surface of the vitreous silica crucible in Comparative Example 1 using the synthetic silica powder without plasma treatment.

FIG. 8 is a polarized photo of a sliced section obtained by vertically slicing the vitreous silica crucible in Comparative Example 1 using the synthetic silica powder without plasma treatment.

FIG. 9 is a polarized photo of a sliced section obtained by vertically slicing the vitreous silica crucible in Example 1 using the plasma-treated synthetic silica powder.

FIG. 10 is a graph representing a distribution of residual stress from the inner surface of the vitreous silica crucible to the outer surface.

MODE FOR CARRYING OUT THE INVENTION

<Vitreous Silica Crucible>

A vitreous silica crucible according to the present invention comprises a substantially cylindrical straight body portion having an opening on the top end and extending in a vertical direction, a curved bottom portion, and a corner portion connecting the straight body portion with the bottom portion, and the curvature of which is greater than that of the bottom portion. The vitreous silica crucible comprises: a transparent layer on the inner surface side; a compressive stress layer which has compressive stress remaining in the inner surface side of the transparent layer, and a tensile stress layer which has tensile stress remaining and is adjacent to the opposite side to the inner surface layer at a gradual rate of change of stress with the compressive stress layer. Hereinafter, each component will be explained in detail.

The silica powder used for manufacturing a vitreous silica crucible includes crystallized natural silica powder and amorphous synthetic silica powder manufactured by chemical synthesis. The natural silica powder is silica powder manufactured by pulverizing natural mineral mainly consisting of α-quartz. The synthetic silica powder can be manufactured by means of chemical synthesis such as gas phase oxidation of silicon tetrachloride ($SiCl_4$) (dry synthesis method), or hydrolysis of silicon alkoxide ($Si(OR_4)$) (sol-gel method).

The vitreous silica crucible having an inner face layer (synthetic layer) vitrified from synthetic silica powder and an outer face layer (natural layer) vitrified from natural silica powder, is manufactured by supplying natural silica powder to a mold used for vitreous silica crucible, further supplying synthetic silica powder on the natural silica powder, and then melting the silica powders by Joule heat of arc discharge. In the initial stage of the arc melting process, bubbles are removed by subjecting the silica powder layer to a strong depressurization, thus a transparent vitreous silica layer (hereinafter referred to as "transparent layer") is formed, and subsequently, a vitreous silica layer (hereafter, referred to as "bubble layer") containing bubbles left by weakening the depressurization is formed. Here, the inner face layer formed from the synthetic silica powder is not necessarily the same as the transparent layer. Moreover, the outer face layer formed from the natural silica powder is not necessarily the same as the bubble layer.

In the present invention, the transparent layer is a layer formed on the inside of the vitreous silica crucible, and is substantially bubble-free. "Substantially bubble-free" means a bubble content rate and bubble diameter at such a degree that a yield of single crystal does not decrease due to the bubbles.

In the present invention, the compressive stress layer is a layer having compressive stress remaining on the inner surface side of the transparent layer.

In the present invention, the tensile stress layer is a layer having tensile stress therein which is adjacent to the compressive stress layer. The tensile stress layer is preferably present, for example, only in the transparent layer, at a ratio of preferably 90% or more, more preferably 95% or more, further preferably 100%, and is preferably not in the bubble layer. The ratio, for example, can be calculated by observing the change of stress in the wall thickness direction from the inner surface of the vitreous silica crucible.

As for the transparent layer, the residual stress from compressive to tensile has a value gradually sloping from the compressive stress to the tensile stress. The ratio of change of stress (rate of change of stress) is preferably 0.17 MPa/mm or more and 1.5 MPa/mm or less, for example, 0.17, 0.2, 0.3, 0.5, 0.7, 0.9, 1.1, 1.3, or 1.5 MPa/mm, and it can be in a range between any two numerical values exemplified here. When the rate of change of stress is less than 0.17 MPa/mm, tensile stress may reach the bubble layer. For this reason, in the bubble layer, fine crazes are likely to occur between bubbles, and then the fine crazes spread to form large cracks. When the rate of change of stress is less than 1.5 MPa/mm, the rate of change toward tensile stress from compressive stress is rapid, and a clear interface between the residual compressive stress and tensile stress can be observed. Therefore, stress concentrates in the interface, which results in a lack of a rim of the vitreous silica crucible and an inward sagging. Since no clear interface exists between the residual compressive stress and tensile stress when the stress changes gradually from the compressive stress to the tensile stress, the stress applied to the vitreous silica crucible is entirely distributed and defects in the vitreous silica crucible are prevented. Especially, as compared to a vitreous silica crucible with a small opening diameter, a vitreous silica crucible with a large opening diameter has a large degree of deformation with respect to external stress and thermal stress applied to the crucible and a high risk of damage. For this reason, for the vitreous silica crucible with a large opening diameter in which the change from the compressive stress to the tensile stress is gradual, it is capable of reducing the risk of damage.

A vitreous silica with stress remaining therein, shows anisotropy at the position where stress remains and an inward sagging occurs. The anisotropy of vitreous silica can be observed, as shown in FIG. 1, by slicing the crucible vertically, placing the sliced crucible section between two polarizing plates combined in a crossed Nicol state, and observing it by passing white light. At this time, the sliced crucible section is polished to a thickness of about 2 mm. When no strain is present in the crucible piece, the crucible piece does not give an optical path difference for the white polarized light, so that the white polarized light which has passed through the crucible piece cannot pass through the crossed polarizing plates (analyzer). When strain is present in the crucible piece, the crucible piece gives an optical path difference for the white polarized light, so that the polarized plane of the white polarized light rotates, and the component that can pass through the crossed polarizing plates (analyzer) is observed. Because an optical path difference according to the strain is generated for each wavelength as the white polarized light passes through the crucible piece having strain, the amount of light passing through the polarizing plates is different for each wavelength. As a result, as for the crucible piece observed through the polarizing plates (analyzer), a color is observed. It is possible to evaluate the strain of the crucible section from the color. For example, by using the interference color chart or polarization color chart showing the relation between chromaticity and birefringence, the strain of the crucible piece can be evaluated and the stress can be calculated from the strain. Moreover, by using a sensitive color method, compressive stress or tensile stress can be determined depending on the color, so that the interface of the residual compressive stress and the residual tensile stress can be observed.

Moreover, by providing a ¼ wavelength plate between the crucible section sample and the detector, the stress of strain can be measured (Senarmont method). Specific measurement method is as follows. First, an analyzer is provided so as to be in a crossed Nicol state with respect to the polarizing plate (polarizer) placed in front of the light source. At this time, the rotating angle θ of the analyzer is 0 degrees. Next, the sample is observed from the analyzer side, and the sample is rotated with respect to the analyzer to make the sample portion to be stress measured become the brightest. Then, the analyzer is rotated horizontally to make the sample portion to be stress measured become the darkest. The stress can be calculated by substituting the rotating angle θ rotating from the brightest state to the darkest state into the following formula (2).

[Formula 1]

$$F = \frac{\lambda \times \frac{\theta}{180}}{C \times L} \quad (2)$$

F: stress (MPa)
λ: wavelength of the light source (nm)
C: photoelastic constant (nm/cm)/MPa
L: optical path length (cm)

The photoelastic constant C of vitreous silica is 3.5±0.2 (nm/cm)/MPa. The wavelength of light source λ is selected to be a wavelength suitable for the ¼ wavelength to be used. With respect to the wavelength of the light source to be used, a suitable ¼ wavelength plate may be selected. The optical path length L is the thickness in the optical axis direction in the sample.

The change of stress from compressive stress to tensile stress can be calculated after plotting the stress F at any distance in the thickness direction from the inner surface of the crucible. Moreover, whether the change from compressive stress to tensile stress in the inner surface side is rapid or is gradual, can be determined by calculating an absolute value (rate of change of stress) of the inclination of the tangent to the interface (that is, the coordinate where stress is 0 MPa) in the distance-stress graph (X axis: distance from the inner surface, Y axis: stress). For example, when the absolute value of the inclination is 0.17 MPa/mm or more and 1.5 MPa/mm or less, the change of stress can be determined to be gradual.

For the conventional vitreous silica crucible, during the pulling of silicon single crystal the vitreous silica crucible has an inward sagging or a buckling, thus the yield of silicon single crystal may be reduced, and in some cases, the pulling of silicon single crystal is required to be stopped. In the vitreous silica crucible according to the present invention, the inner surface of the vitreous silica crucible is strengthened by residual compressive stress on the inner surface side of the transparent layer, and a change to tensile stress toward the outside at a gradual rate of change of stress is made so that the tensile stress remains in the transparent layer. When the tensile stress remains in the bubble layer, fine crazes are likely to generate between the bubbles, and the fine crazes become large cracks when spreading, which is necessary to be avoided. Therefore, it is preferable to have tensile stress remain in the transparent layer.

In the present invention, the bubble layer is formed on the outer side of the transparent layer. The bubble layer for example has a content rate of bubbles contained therein of 0.2% or more and 1% or less, and the average diameter of the bubbles is 20 μm or more and 200 μm or less.

The vitreous silica crucible according to the present invention preferably has a maximum bubble content rate of 0.10 Vol % or less. Furthermore, the vitreous silica crucible according to the present invention preferably has an average bubble diameter of 50 μm or less. When bubbles exist even slightly near the inner surface of the vitreous silica crucible, bubble-expansion occurs in the transparent layer during the pulling of silicon single crystal. The resulting bubbles intrude into the silicon melt with the melting of the inner face side of the transparent layer, and the bubbles are entrapped in the pulled silicon single crystal. The entrapped bubbles cause dislocation (crystal defects) due to crystalline transition, and reduce the yield of single crystal. Thus, when the maximum bubble content rate of the vitreous silica crucible is more than 0.10 Vol %, the reduction of yield of single crystal becomes significant. Moreover, when the average bubble diameter of the vitreous silica crucible is more than 50 μm, the expansion of bubbles causes a deformation of the vitreous silica crucible.

The bubbles existing near the inner surface of the vitreous silica crucible can be detected by using for example an optical detection unit. The optical detection unit includes a light-receiving apparatus which receives the transmitted light or reflected light of the light irradiated to a vitreous silica crucible. A light-emitting means of irradiation light may be integrated into the optical detection unit, and an external light-emitting means may also be utilized. Further, an optical detection unit being operated rotatably along the inner surface of the vitreous silica crucible is used. As the irradiation light, any light may be used as long as bubbles can be detected by the reflection of the light, and for example visible light, ultraviolet light, infrared light, and laser light are exemplified. The light-receiving apparatus is selected depending on the type of the irradiation light, and can be for example, a digital camera having an optical lens and an image pickup unit. Bubbles existing at a certain depth from the surface can be detected by moving the focus of the objective lens from the surface to the depth direction.

The measurement result obtained by the optical detection unit is input into an image processing device, and the bubble content rate P (%) is calculated. The image of the crucible inner surface is taken by use of an optical camera, and the crucible inner surface is divided based on a constant volume as a reference volume W1. A volume W2 occupied by bubbles is determined for the reference volume W1, and calculated by P (%)=(W2/W1)*100. The bubble content rate can be obtained by the volume of bubbles contained in the reference volume of the crucible, and the maximum bubble content rate can be the bubble content at the point having the highest value among the measured points. The maximum bubble content rate at a thickness from the crucible inner surface to the external surface direction of up to 0.3 mm, is preferred to be 0.05 Vol % or less.

At this time, the bubbles are measured to have a bubble diameter of 10 μm or more. When more than 0.05 Vol %, the reduction of yield of single crystal becomes significant. Moreover, since the reduction of yield of single crystal becomes significant when the maximum bubble diameter is more than 100 μm, the maximum bubble diameter is preferred to be 100 μm or less.

The average bubble diameter can be measured by calculating the average value of the diameters of spherical bubbles in the measuring range. The diameters can be calculated by software after obtaining an image of the vitreous sample.

Moreover, during the pulling of silicon single crystal, concavo-convex portions exist in the inner surface of the vitreous silica crucible, thus nonuniform cores are likely to generate. Foreign substance resulting from the growth of the core is sloughed off by corrosion and floats in the silicon melt, and thus adheres to the growing interface of the silicon single crystal being pulled up, so that a quality defect such as polycrystallization or dislocation occurs. The arithmetic average roughness (Ra) of the inner surface of the vitreous silica crucible is preferred to be 0.02 μm or less. In the case of more than 0.02 μm, the probability of generation of nonuniform cores increases, and the reduction of yield of single crystal becomes significant. From the roughness curve, a reference length is extracted in a direction of a mean line of the roughness curve, and the direction of the mean line in this extracted part is defined as an X axis, while a direction of a longitudinal magnification is defined as a Y axis, then a value integrated over the roughness curve with respect to the centerline is presented as the Ra in micrometers.

<Method for Manufacturing a Vitreous Silica Crucible>

Next, a method for manufacturing a vitreous silica crucible for pulling of silicon single crystal according to the present invention will be described.

First, a natural silica powder is supplied to a rotating mold for manufacturing a vitreous silica crucible, and a layer of the natural silica powder is formed in the inner face of the rotating mold for manufacturing the vitreous silica crucible. The natural silica powder can be manufactured by pulverizing natural mineral mainly consisting of α-quartz.

Next, a synthetic silica powder which satisfies following Formula (1) obtained by Raman measurement method is deposited on the inside of the layer of the natural silica powder.

$$0.8 \leq R \leq 1.0 \quad (1)$$

in Formula (1), intensity ratio $R=(I_1+I_2)/I_0$
$I_1$=peak intensity of Raman shift 492 $cm^{-1}$ band
$I_2$=peak intensity of Raman shift 606 $cm^{-1}$ band
$I_0$=peak intensity of Raman shift 800 $cm^{-1}$ band The measurement conditions of the Raman method can be: for example, wavelength: 532 nm; exposure time: 20 seconds; and cumulative number: 1 time. The Raman spectrum of the synthetic silica powder obtained from the condition is observed at characteristic peaks in Raman shift 492 $cm^{-1}$ band, 606 $cm^{-1}$ band and 800 $cm^{-1}$ band, and each band responding to scattering peak of planar four-member ring (D1), scattering peak of planar three-member ring (D2), and scattering peak due to the fundamental vibration between silicon and oxygen, respectively. The peak intensity at each peak is the area at each peak. The peak area can be calculated by integrating the change in the electrical signal at the peak with time wherein a line connecting the falling point and the rising point of the peak is used as a base line. Further, as an example of other method, half-value method, triangular approximation method, and peak clipping method can be exemplified.

The intensity ratio R is 0.80 or more and 1.0 or less. The intensity ratio R may be, for example, 0.80, 0.85, 0.90, 0.95, 1.00, and may be within a range between any two of the numerical values exemplified herein. When the intensity ratio R is less than 0.80, the synthetic silica powder lacks planar three-member rings and planar four-member rings involved in a dense state, and a high dense state is not maintained in the synthetic silica powder. Such synthetic silica powder has small change in the vitreous structure during melting, the vitreous structure is likely to become uniform after melting, and the stress changes of compressive stress and tensile stress in the transparent layer are likely to become steep. On the contrary, when the intensity ratio R is more than 1.0, since a higher-density state due to the increase in the number of planar three-member rings and planar four-member rings is maintained in the synthetic silica powder, the change in vitreous structure during arc melting requires much time, and the stress changes of the compressive stress and the tensile stress in the transparent layer are likely to become steep.

A vitreous silica crucible manufacture using synthetic silica powder having an intensity ratio R of 0.80 or more and 1.0 or less enables both compressive stress and tensile stress to be remained in the transparent layer with a moderate difference in stress. Accordingly, the vitreous silica crucible without cracks, inward sagging, and buckling, even under a high temperature condition for a long-time, can be manufactured.

The circularity of the synthetic silica powder is preferably 0.73 or more and 1.0 or less. Because gaps between particles are small for synthetic silica powder having spheroid particles, the gaps are easily occupied during melting and the residuum of a gas component in the vitreous silica crucible can be prevented. When the circularity is less than 0.73, the gaps between the particles are large, so that the gaps are not occupied during melting and a gas component remains in the vitreous silica crucible, the bubble content rate may increase.

The circularity can be obtained, for example, as follows. First, the synthetic silica powder is dispersed into a liquid, which is then flowed through a planar elongational flow cell. 200 powder particles moving through the planar elongational flow cell are recorded as images by an objective lens, thereby from the recorded images a circularity is calculated by the following Formula (3). The measurement is performed twice, and the average value can be the circularity of the powder. Also, when the particles are perfect circles, the circularity is 1.

$$\text{circularity}=4\pi S/L^2 \quad (3)$$

S: area of a particle in the projection view of the recorded image by photographing
L: perimeter of a particle in the projection view It is not necessary for all the synthetic silica powders for use to have a circularity of 0.73 or more and 1.0 or less, and the proportion of such silica particles is preferably 90% or more, more preferably 95% or more, further preferably 99% or more.

The synthetic silica powder preferably has an average particle diameter of 80 μm or more and 160 μm or less. The average particle diameter is, for example, 80, 85, 90, 95, 100, 110, 120, 130, 140, 150, or 160 μm, and it may be within a range between any two of the numerical values exemplified here. When the average particle diameter is 160 μm or less, since the spacing among the particles is small, it is possible to reduce the size of the bubbles in the vitreous silica crucible formed due to the entrainment of ambient gas. As a result, bubbles can be shrunk and eliminated during arc melting. However, when the average particle diameter is more than 160 μm, the size of spacing between the particles is large, thus the size of bubbles in the vitreous silica crucible formed due to the entrainment of ambient gas is large, and although the shrinking of bubbles during arc melting proceeds, the bubbles may not be eliminated. When the average particle diameter is less than 80 μm, degassing by evacuating is insufficient and bubbles may remain, because of the rapid melting by arc melting.

"Average particle diameter" means a particle diameter (D 50) at 50% cumulative value in the obtained particle size distribution, and means a volume average particle diameter in the present specification. For the measurement of the particle size distribution, a laser diffracting/scattering measurement method using laser light as a light source can be employed. "Particle size" is defined in a section of JIS Z 8901 "Powder Body for Test and Particle for Test."

The synthetic silica powder preferably has a tapped bulk density of 1.35 g/cm$^3$ μm or more and 1.44 g/cm$^3$ or less. The tapped bulk density is, for example, 1.35, 1.38, 1.39, 1.40, 1.41, 1.42, 1.43, or 1.44 g/cm$^3$, and it may be within a range between any two of the numeral values exemplified herein. When the tapped bulk density is less than 1.35 g/cm$^3$, the bubble content rate may increase. This is presumably because gas is enclosed during melting because the spacing among particles is large. When the tapped bulk density is less than 1.44 g/cm$^3$, degassing by evacuating is insufficient and bubbles become easy to remain.

The tapped bulk density can be obtained according to a density when the volume of the sample does not change after dispersing and filling the sample in a container and then applying impact to the container by tapping. For example, a tapping apparatus is provided to a measurement container having a sample therein and which bears an auxiliary cylinder, and tapping is performed 600 times. The mass is measured after leveling off the sample. The sample is supplemented again, and the tapping apparatus is provided to the measurement container with the auxiliary cylinder, and then tapping is performed 100 times. The mass is measured after leveling off the sample, and the performance is repeated until the mass difference from the previous mass is 0.3% or less. The mass of the sample is divided by the volume of the measurement container to obtain the tapped bulk density. It is possible to perform the measurement 3 times, and adopt the average value.

The synthetic silica powder preferably has a specific surface area of 0.026 m$^2$/g or more and 0.045 m$^2$/g or less. The specific surface area is, for example, 0.026, 0.028, 0.030, 0.032, 0.034, 0.036, 0.038, 0.040, or 0.045 m$^2$/g, and it can be within a range between any two of numeral values exemplified here. When the specific surface area is more than 0.045 m$^2$/g, gas existing on the flaw or crack surface is entrapped during melting, and remains as bubbles; thus the bubble content rate is raised. On the other hand, when the specific surface area is less than 0.026 m$^2$/g, gas existing in the central portion of the silica particle can be prevented from coming out of the surface during melting. From this, it is preferable that depressions exist on the surface to some extent so that the bubble content rate can be reduced.

Specific surface area can be obtained by a nitrogen adsorption method. The nitrogen adsorption method includes: (1) adsorbing nitrogen gas to the synthetic silica powder while increasing pressure gradually from a high vacuum; (2) creating an adsorption isotherm by plotting the relative pressure to the X axis, the amount of nitrogen adsorbed to the Y axis; (3) determining the specific surface area by applying the data of the adsorption isotherm to various adsorption isotherm formulas. As the adsorption isotherm, for example, Henry adsorption isotherm formula, Langmuir adsorption isotherm formula, and BET adsorption isotherm formula can be mentioned.

It is not necessary for all the synthetic silica powder for use to have a specific surface area of 0.026 m$^2$/g or more and 0.045 m$^2$/g or less, and the proportion of such silica particles is preferably 90% or more, more preferably 95% or more, further preferably 99% or more.

The synthetic silica powder to be used in the present invention can be manufactured by, for example, subjecting the synthetic silica powder material to a plasma treatment, subsequently to a treatment at a cooling speed of 10$^5$ K/min or more. The synthetic silica powder material can be manufactured by means of chemical synthesis such as gas phase oxidation of silicon tetrachloride (SiCl$_4$) (dry synthesis method), or hydrolysis of silicon alkoxide (Si(OR$_4$)) (sol-gel method).

The plasma treatment can be performed by, for example, using a plasma reactor (for example, high-frequency induction-heat plasma generation apparatus), and the plasma treatment with such plasma reactor facilitates a quick-heating/quick-cooling treatment. The plasma treatment is preferably a heat plasma treatment capable of performing continuously a heating-cooling process. The plasma reactor is configured by a plasma torch generating plasma and a cooling apparatus provided directly after the plasma torch. The plasma torch includes a material supply pipe and a gas supply pipe, the outer periphery of which is provided with a high-frequency induction coil. The frequency applied to the high-frequency induction coil is, for example, 1-15 MHz, specifically, 1, 2, 3, 4, 5, 6, 7, 8, 9, 10, or 15 MHz, and it may be within a range between any two of the numeral values exemplified herein. The output may be 90-150 kW, specifically, 90, 100, 110, 120, 130, 140, or 150 kW, and it may be within a range between any two of the numeral values exemplified herein. As for the supplied gas, for example, argon or oxygen can be selected. The gas may be, for example, a mixed gas of oxygen and argon, and in this case, the oxygen partial pressure is, for example, 10-30%, specifically, 10, 15, 20, 25, or 30%, and it may be within a range between any two of the numeral values exemplified herein. The amount of supplied gas is for example, 30-150 L/min, specifically, 30, 40, 50, 60, 70, 80, 90, 100, 110, 120, 130, 140, or 150 L/min, and it may be within a range between any two of the numeral values exemplified herein. By supplying gas while energizing the high-frequency induction coil, plasma is generated in the plasma torch. The synthetic silica powder material is supplied into the plasma torch in which plasma is generated. The supply rate of the material is, for example, 20-50 kg/hr, specifically, 20, 23, 25, 28, 30, 35, 40, 45, or 50 kg/hr, and it may be within a range between any two of the numeral values exemplified herein.

By quenching the synthetic silica powder with a cooling apparatus immediately after passing through the plasma torch, a synthetic silica powder having desired intensity ratio R can be manufactured. The cooling speed is, preferably, 10$^5$ K/min or more, more preferably 10$^6$K/min or more. The cooling method is not especially limited, and is preferably cooling by air-cooling, more preferably cooling by water-cooling. Especially, in the case of heat plasma treatment, by providing a water-cooling apparatus to the plasma torch exit, an efficient cooling can be obtained. Thus, a synthetic silica powder reflecting the heat history is stabilized and obtained. Further, the supply rate of the material and the output can be improved, and a plasma-treated synthetic silica powder can be manufactured in a short time. It is known that the degree of strain in the vitreous silica varies depending on a fictive temperature. Therefore, by cooling the vitreous silica of high temperature rapidly, the structure distribution at high temperature is fixed, so that the degree of strain in the vitreous silica can be controlled.

The stacked natural silica powder and the synthetic silica powder obtained in the manner described above are subjected to arc discharge. As for the arc discharge, a well-known method can be adopted. For example, glass melting by arc discharge of rotating mold method can be adopted.

After the arc discharge, it is preferable to further include a process of introducing cooling gas into the mold.

The cooling gas can be introduced into the mold from a tube for evacuation of the mold. Thus, the outer surface side of the vitreous silica crucible can be efficiently cooled, and compressive stress being retained in the bubble layer side and tensile stress being retained in bubble layer side can be prevented.

The cooling gas can be introduced by using a compressor such as a blower with cleaning function. The discharge gas volume of the compressor, for example, in the case of a 32-inch vitreous silica crucible, can be 10-50 m$^3$/min, specifically, 10, 20, 30, 40, or 50 m$^3$/min, and it may be within a range between any two of the numeral values exemplified herein. The discharge gas volume can vary according to the size of the vitreous silica crucible to be manufactured. When the discharge gas volume is less than 10 m$^3$/min, tensile stress remains in the bubble layer due to insufficient cooling. When the discharge gas volume is more than 50 m$^3$/min, tensile stress remains in the inner surface side due to excessive cooling. Thus, the change of tensile stress from compressive stress of the inner surface side becomes steep, and a clear interface between compressive stress and tensile stress occurs. The cooling gas to be introduced is not especially limited, and for example, helium, argon, nitrogen, or air can be selected. The temperature of the cooling gas is not especially limited, and room temperature can be selected. In the mold, an exhaust pipe may be provided and the cooling gas in the mold may be discharged out of the mold.

<Example of Use>

The vitreous silica crucible for pulling a silicon single crystal according to the present invention, for example, can be used as follows. Polycrystalline silicon (polysilicon) is supplied into the vitreous silica crucible, and heated with a heater thereby the polycrystalline silicon is melted. The silicon single crystal is manufactured by pulling up while rotating a seed crystal with the tip of the silicon seed crystal being immersed in the silicon melt. The shape of the silicon single crystal is as follows: a cylindrical silicon seed crystal from the upper side, followed by a conical silicon single crystal (top portion), a cylindrical silicon single crystal (straight body portion) having the same diameter as the bottom surface of the upper conical silicon single crystal, and a silicon single crystal (tail portion) having a vertex orienting downward.

As for the vitreous silica crucible for pulling a silicon single crystal according to the present invention, the maximum bubble content rate, the average density of the number of open bubbles, the average density of the number of brown rings, and the average diameter of brown rings of the transparent layer of the vitreous silica crucible after the pulling of silicon single crystal can be reduced significantly, and the yield of single crystal can be improved. The yield of single crystal is defined as the weight ratio of the silicon crystal relative to silicon raw material. However, not all silicon melt in the crucible is necessarily used and only the straight body portion excluding the top portion and the tail portion of the silicon single crystal ingot is subject to the calculation of the yield of single crystal. Therefore, the yield of single crystal is 100% or less even when sufficient silicon single crystal is pulled up, and is good to be 80% or more, better to be 90% or more.

The maximum bubble content of the vitreous silica crucible after the pulling of silicon single crystal is preferred to be 0.1 Vol % or less. Under such condition, the mixing of bubbles in the silicon single crystal can be reduced, and a good yield of single crystal can be achieved. The maximum bubble content rate can be obtained in the same manner as the maximum bubble content prior to use of the vitreous silica crucible.

In the present embodiment, the average density of the number of open bubbles of the vitreous silica crucible after the pulling of silicon single crystal is preferable to be 7 (number/cm$^2$) or less. Under such condition, the mixing of bubbles in the silicon single crystal can be reduced, and a good yield of single crystal can be achieved. An open bubble is a depression derived from a bubble and appearing in the inner surface of the vitreous silica crucible as a result of dissolved loss during the pulling of silicon single crystal. The density of the number of open bubbles can be calculated by counting, after performing the pulling of silicon single crystal, the number of open bubbles per unit area formed in the inner surface of the vitreous silica crucible, by microscope observation. Moreover, the average density of the number of open bubbles can be calculated from the average value of the densities of the numbers of open bubbles in the straight body portion, the bottom portion, and corner portion of the vitreous silica crucible.

The average density of the number of brown rings of the vitreous silica crucible after the pulling of silicon single crystal pulling is, preferably, 7 (number/cm$^2$) or less. Here, the brown ring is brown cristobalite which generates in the inner surface of the vitreous silica crucible when in contact with the silicon melt at high temperature for a long time. As the pulling of a single crystal proceeds, cristobalite grows on the inner surface of the vitreous silica crucible or in a direction perpendicular to the inner surface to form a ring-shaped spot. The formed brown ring is likely to be sloughed off. The sloughed-off brown ring is conveyed into the silicon single crystal when falling/mixing in the silicon melt. As a result, the pulled up silicon ingot is polycrystallized, and the yield of single crystal is reduced. When the average density of the number of brown rings of the vitreous silica crucible is low, the proportion of the brown ring falling/mixing in the silicon melt is reduced, thus the reduction of yield of single crystal can be suppressed, and good yield of single crystal can be achieved. The density of the number of brown rings can be calculated by counting, after performing the pulling of silicon single crystal, the number of the brown rings per unit area formed in the inner surface of the vitreous silica crucible, by microscope observation. Moreover, the average density of the number or brown rings can be calculated from the average value of the densities of the numbers of brown rings in the straight body portion, the bottom portions and the corner portion of the vitreous silica crucible.

The average diameter of the brown rings of the vitreous silica crucible after the pulling of silicon single crystal pulling is preferably 4 mm or less. Under such condition, the growth of brown rings is suppressed, the proportion of the brown rings falling/mixing in the silicon melt is reduced, and thus the reduction of yield of single crystal can be suppressed and good yield of single crystal can be achieved. The brown ring diameter is the diameter of the brown ring formed on the inner surface of the vitreous silica crucible after the pulling of silicon single crystal. The average brown ring diameter can be determined by measuring the diameters of brown rings per 100 from the straight body portion, the bottom portion, and the corner portion extending from the straight body portion to the bottom portion of the vitreous silica crucible, and by calculating the average value.

In the heating process of CZ single crystal pulling, the glass softening temperature is exceeded, and the glass transition point is exceeded, thus the internal residual compressive stress and the internal residual tensile stress is eliminated. The abrupt occurrence of the structural rearrangement of Si—O—Si bonds that occurs at that time is prevented, so that the conventional buckling or inward sagging does not occur. In order to prevent the structural rearrangement of Si—O—Si bonds from occurring abruptly in the transparent layer, a vitreous silica crucible in which the internal residual compressive stress and the internal residual tensile stress change gradually is used in the CZ single crystal pulling. Usually, glass has residual tensile stress on the outer side of the residual compressive stress existing layer. This is because, when a quartz crucible is manufactured by arc method, the inner surface side is cooled faster than the inside of the transparent layer. In order to manufacture a vitreous silica crucible in which the residual stress changes gradually, a method as described in the section "method for manufacturing vitreous silica crucible" may be used.

EXAMPLES

[Manufacture of the Synthetic Silica Powder]

Manufacture Example 1

A synthetic silica powder obtained by hydrolysis of alkoxysilane was calcined under a low vacuum condition, and a calcined synthetic silica powder was obtained. The obtained synthetic silica powder material was introduced into a high-frequency induction-heat plasma generation apparatus with cooling apparatus. The condition of the plasma generation apparatus was as follows; frequency: 7-10 MHz, output: 100-110 kW, gas: argon-oxygen mixed gas (oxygen partial pressure 20%), gas supply amount: 90-110 L/min, material supply rate: 25-35 kg/hr. After the plasma treatment, the plasma-treated synthetic silica powder, using the plasma reactor with water-cooling apparatus, was quenched at a cooling rate of $10^6$ K/min or more. After the heat plasma treatment, the synthetic silica powder was recovered, and washed by ultrasonic washing using ultra-pure water. The washing was performed until the synthetic silica powder was free of fine particles adhering thereto. The synthetic silica powder after washing was classified, and a synthetic silica powder according to Manufacture Example 1 was obtained. The intensity ratio R, the average particle diameter, the specific surface area, the tapped bulk density and the circularity of the synthetic silica powder were measured as follows, and the results were shown in Table 1.

Intensity Ratio R:

A dispersive type micro-Raman apparatus was used. The measurement condition was: laser wavelength: 532 nm (5 mw), exposure time: 20 seconds, cumulative number: 1 time. The peak intensity $I_1$ of Raman shift 492 $cm^{-1}$ band, the peak intensity $I_2$ of Raman shift 606 $cm^{-1}$ band, and the peak intensity $I_0$ of Raman shift 800 $cm^{-1}$ band were calculated by integrating the change in the electrical signal at the peak with time, and the intensity ratio R was obtained from formula $(I_1+I_2)/I_0$. The Raman spectra of Manufacture Example 1 and Comparative Manufacture Example 1 are shown in FIG. 4.

Average Particle Diameter:

A particle size distribution was obtained by laser diffracting/scattering measurement method using a laser light as a light source, and the particle diameter (D 50) of 50% integrated value in the obtained particle size distribution was the average particle diameter.

Specific Surface Area:

The specific surface area was obtained by a gas adsorption method using BET adsorption isotherm formula.

Tapped Bulk Density:

A measurement container in which a sample (silica powder) was introduced with an attached auxiliary cylinder was provided to a tapping apparatus, and tapping was performed 600 times. The mass was measured after leveling off the sample. The sample was supplemented again, and the measurement container with the attached auxiliary cylinder was provided to the tapping apparatus, then tapping was performed 100 times. The mass was measured after leveling off the sample, and the performance was repeated until the mass difference from the previous mass was 0.3% or less. The mass of the sample was divided by the volume of the measurement container to obtain the tapped bulk density. The measurement was performed 3 times, and the average value was the tapped bulk density.

Circularity:

The obtained synthetic silica powder was dispersed into a liquid, which was then flowed through a planar elongational flow cell. 200 powder particles moving through the planar elongational flow cell were recorded as images by an objective lens, thereby from the recorded images circularity was calculated by the following Formula (3). The measurement was performed twice, and the average value was the circularity of the powder. Also, when the particles were perfect circles, the circularity was 1.

$$\text{circularity}=4\pi S/L^2 \quad (3)$$

S: area of a particle in the projection view of the recorded image by photographing L: perimeter of a particle in the particle projection view FIG. 2 is electron microscope photos of the external appearance and cross sections of a plasma-treated synthetic silica powder of Manufacture Example 1.

Manufacture Examples 2-6

In the classified synthetic silica powders after washing, the synthetic silica powders of Manufacture Examples 2-6 were obtained in the same manner as in Manufacture Example 1, except that classified synthetic silica powder different from Manufacture Example 1 was used. In the same manner as in Manufacture Example 1, the intensity ratio R, the average particle diameter, the Specific surface area, the tapped bulk density, and the circularity of the synthetic silica powder were determined, and the results are shown in Table 1.

Comparative Manufacture Examples 1-3

In the classified synthetic silica powders after washing without heat plasma treatment, the synthetic silica powders of Comparative Manufacture Examples 1-3 were obtained in the same manner as in Manufacture Example 1, except that classified synthetic silica powder different from Manufacture Example 1 was used. In the same manner as in Manufacture Example 1, the intensity ratio R, the average particle diameter, the Specific surface area, the tapped bulk density, and the circularity of the synthetic silica powder were determined, and the results are shown in Table 1.

FIG. 3 is electron microscope photos of the external appearance and cross sections of the synthetic silica powder of Comparative Manufacture Example 1.

Comparative Manufacture Examples 4-12

The heat plasma treatment was performed by using a high-frequency induction-heat plasma generation apparatus without cooling apparatus instead of the high-frequency induction-heat plasma generation apparatus with a cooling apparatus, and with regard to the classified synthetic silica powder after washing, the synthetic silica powders of Comparative Manufacture Examples 4-12 were obtained in the same manner as in Manufacture Example 1, except that classified synthetic silica powder different from Manufacture Example 1 was used. In the same manner as in Manufacture Example 1, the intensity ratio R, the average particle diameter, the Specific surface area, the tapped bulk density, and the circularity of the synthetic silica powder were determined, and the results are shown in Table 1.

TABLE 1

| | Intensity ratio (R) | Average particle diameter (μm) | Specific surface area (m²/g) | Tapped bulk density (g/cm³) | Circularity |
|---|---|---|---|---|---|
| Manufacture Example 1 | 0.85 | 104 | 0.034 | 1.41 | 0.85 |
| Manufacture Example 2 | 0.95 | 150 | 0.026 | 1.44 | 0.91 |
| Manufacture Example 3 | 0.83 | 87 | 0.030 | 1.39 | 0.87 |
| Manufacture Example 4 | 0.84 | 135 | 0.033 | 1.44 | 0.75 |
| Manufacture Example 5 | 0.86 | 150 | 0.044 | 1.35 | 0.88 |
| Manufacture Example 6 | 0.85 | 160 | 0.045 | 1.37 | 0.73 |
| Comparative Manufacture Example 1 | 0.74 | 132 | 0.035 | 1.43 | — |
| Comparative Manufacture Example 2 | 0.71 | 98 | 0.038 | 1.40 | — |
| Comparative Manufacture Example 3 | 0.68 | 122 | 0.027 | 1.44 | — |
| Comparative Manufacture Example 4 | 1.15 | 148 | 0.031 | 1.40 | 0.77 |
| Comparative Manufacture Example 5 | 1.19 | 101 | 0.029 | 1.41 | 0.76 |
| Comparative Manufacture Example 6 | 0.72 | 118 | 0.027 | 1.38 | 0.77 |
| Comparative Manufacture Example 7 | 1.14 | 52 | 0.044 | 1.33 | 0.95 |
| Comparative Manufacture Example 8 | 1.13 | 65 | 0.041 | 1.37 | 0.88 |
| Comparative Manufacture Example 9 | 0.71 | 261 | 0.021 | 1.49 | 0.91 |
| Comparative Manufacture Example 10 | 0.69 | 95 | 0.100 | 1.25 | 0.75 |
| Comparative Manufacture Example 11 | 0.73 | 312 | 0.052 | 1.40 | 0.79 |
| Comparative Manufacture Example 12 | 0.74 | 454 | 0.036 | 1.34 | 0.78 |

[Manufacture of Vitreous Silica Crucible]

Examples 1-6, Comparative Examples 1-12

Vitreous silica crucibles of Examples 1-6 and Comparative Examples 1-12 were manufactured respectively by using Manufacture Examples 1-6 and Comparative Manufacture Examples 1-12 as the synthetic silica powder, on the basis of a rotating mold method. The mold opening diameter was 32 inches (81.3 cm), the average thickness of silica powder layer deposited on the mold inner surface was 25 mm, and arc discharge was performed with 3 electrodes at 3-phase alternating current. The energization time of the arc melting process was 90 minutes, output was 2500 kVA, and the evacuation of the silica powder layer was started in 10 minutes from the start of energization. After the arc melting, air was sent into the mold by using a blower with cleaning function at a discharge gas volume of 20-30 m³/min. In the obtained crucibles of Examples 1-6 and Comparative Examples 1-12, the average bubble diameter, the maximum bubble content rate, and the surface roughness (Ra) were determined as follows, and the results are shown in Table 2.

Average Bubble Diameter:

The average bubble diameter was obtained as the average value of diameters of the spherical bubbles in the measuring range. The diameter was obtained through picking up the image of the vitreous sample, then determining by software.

Maximum Bubble Content Rate:

The maximum bubble content rate was obtained by the volume of bubbles contained per unit volume of the crucible. The bubble content rate of the point having the highest value among the measured points was the maximum bubble content rate.

Surface Roughness (Ra):

The inner surface of the vitreous silica crucible was cut and then a laser confocal microscope was used to measure roughness of the inner surface without contact, the coordinate points were determined, and the height differences in the inner surface were determined with software to obtain the surface roughness. FIG. 6 is a photo of the surface of the vitreous silica crucible according to Example 1, FIG. 7 is a photo of the surface of the vitreous silica crucible according to Comparative Example 1.

TABLE 2

| | Average bubble diameter (μm) | The maximum bubble content rate (Vol %) | Surface roughness (Ra) (μm) |
|---|---|---|---|
| Example 1 | 37 | 0.008 | 0.012 |
| Example 2 | 40 | 0.004 | 0.020> |
| Example 3 | 36 | 0.005 | 0.020> |
| Example 4 | 47 | 0.009 | 0.020> |
| Example 5 | 46 | 0.011 | 0.020> |
| Example 6 | 50 | 0.021 | 0.020> |
| Comparative Example 1 | 48 | 0.48 | 0.025 |
| Comparative Example 2 | 34 | 0.39 | 0.020< |
| Comparative Example 3 | 38 | 0.45 | 0.020< |
| Comparative Example 4 | 51 | 0.25 | 0.020< |
| Comparative Example 5 | 49 | 0.29 | 0.020< |
| Comparative Example 6 | 57 | 0.34 | 0.020< |
| Comparative Example 7 | 35 | 0.52 | 0.020< |
| Comparative Example 8 | 43 | 0.69 | 0.020< |
| Comparative Example 9 | 55 | 0.58 | 0.020< |
| Comparative Example 10 | 50 | 0.71 | 0.020< |
| Comparative Example 11 | 68 | 0.69 | 0.020< |
| Comparative Example 12 | 85 | 0.79 | 0.020< |

In Examples 1-3 and Comparative Examples 1-3 and 13-18, the rate of change of stress was measured as follows, and the results are shown in Table 3.

Rate of Change of Stress:

Residual stress in the vitreous silica crucible was measured by the Senarmont method. The measurement was conducted from the inner surface in the wall thickness direction at intervals of 0.5-1.0 mm, and a stress-distance graph was created. From the stress-distance graph, the inclination (rate of change of stress) of the tangent to the position where the stress is 0 MPa (that is, the interface) was obtained. For the vitreous silica crucibles of Example 1 and Comparative Example 1, the stress-distance graphs are shown in FIG. 10.

Comparative Example 13

The vitreous silica crucible of Comparative Example 13 was obtained in the same manner as in Example 1 except that the volume of discharge gas by the blower with cleaning function was changed to 5 m³/min. In the same manner as in Example 1, the rate of change of stress was measured, and the result is shown in Table 3.

Comparative Example 14

The vitreous silica crucible of Comparative Example 14 was obtained in the same manner as in Example 2 except that the volume of discharge gas by the blower with cleaning function was changed to 5 m³/min. In the same manner as in Example 1, the rate of change of stress was measured, and the result is shown in Table 3.

Comparative Example 15

The vitreous silica crucible of Comparative Example 15 was obtained in the same manner as in Example 3 except that the volume of discharge gas by the blower with cleaning function was changed to 5 m³/min. In the same manner as in Example 1, the rate of change of stress was measured, and the result is shown in Table 3.

Comparative Example 16

The vitreous silica crucible of Comparative Example 16 was obtained in the same manner as in Example 4 except that the volume of discharge gas by the blower with cleaning function was changed to 5 m³/min. In the same manner as in Example 1, the rate of change of stress was measured, and the result is shown in Table 3.

Comparative Example 17

The vitreous silica crucible of Comparative Example 17 was obtained in the same manner as in Example 5 except that the volume of discharge gas by the blower with cleaning function was changed to 5 m³/min. In the same manner as in Example 1, the rate of change of stress was measured, and the result is shown in Table 3.

Comparative Example 18

The vitreous silica crucible of Comparative Example 18 was obtained in the same manner as in Example 6 except that the volume discharge gas by the blower with cleaning function is changed to 5 m³/min. In the same manner as in Example 1, the rate of change of stress was measured, and the result was shown in Table 3.

Reference Example 1: Bubble Content Rate

In the transparent layer of the vitreous silica crucibles according to Example 1 and Comparative Example 1, the bubble content rates from the bottom portion through the corner portion to the straight body portion (wall portion) of the crucible were measured. FIG. 5 is a graph plotting X axis as each part of the vitreous silica crucible, and Y axis as bubble content rate (Vol %). For the vitreous silica crucible of Comparative Example 1, in comparison to the increasing of the bubble content rate through the wall portion from the corner portion, the vitreous silica crucible of Example 1 showed a bubble content rate of 0.01 Vol % or less only in the wall portion. Therefore, that the vitreous silica crucible of Example 1 was substantially free of bubble was understood.

Reference Example 2: Strain Observation

The vitreous silica crucibles of Example 1 and Comparative Example 1 were cut vertically at a position of 600 mm in rim direction along the inner surface from an intersection point of the central axis and the bottom portion, and the sliced piece was polished until the thickness was about 2 mm. The polished cross-sectional sample (sliced piece) was used to examine compressive stress or tensile stress based on sensitive color. As a result, the inner surface side of any sample had residual compressive stress, and residual tensile stress adjacent to the compressive stress (not shown).

FIG. 8 is a polarized photo of the cross sectional sample of the vitreous silica crucible according to Comparative Example 1. For the vitreous silica crucible of Comparative Example 1, a clear interface between compressive stress and tensile stress was observed. There was an interface between compressive stress layers 1 and 2 having different degrees, and thus, there were two compressive stress layers.

FIG. 9 is a polarized photo of the cross sectional sample of the vitreous silica crucible according to Example 1. For the vitreous silica crucible of Example 1, no clear interface existed between the compressive stress and the tensile stress. That is, compressive stress and tensile stress changed gradually.

Reference Example 3: The Inner Surface of the Vitreous Silica Crucible

A laser confocal microscope photo of the inner surface of the vitreous silica crucible according to Example 1 is shown in FIG. 6, a laser confocal microscope photo of the inner surface of the vitreous silica crucible according to Comparative Example 1 is shown in FIG. 7.

TABLE 3

|  | Example | | | Comparative Example | | | | | | | | |
| --- | --- | --- | --- | --- | --- | --- | --- | --- | --- | --- | --- | --- |
|  | 1 | 2 | 3 | 1 | 2 | 3 | 13 | 14 | 15 | 16 | 17 | 18 |
| Stress difference (MPa) | 0.10 | 0.40 | 0.13 | 1.70 | 1.43 | 1.02 | 0.025 | 0.03 | 0.064 | 1.09 | 1.25 | 1.38 |
| Distance Difference (mm) | 0.6 | 0.3 | 0.4 | 0.3 | 0.5 | 0.2 | 0.5 | 0.2 | 0.4 | 0.2 | 0.4 | 0.3 |
| Rate of change of stress (MPa/mm) | 0.17 | 1.33 | 0.33 | 5.67 | 2.86 | 5.10 | 0.05 | 0.15 | 0.16 | 5.45 | 3.13 | 4.60 |

Reference Example 4: Pulling of Silicon Single Crystal

Pulling of silicon single crystal was performed using the vitreous silica crucibles of Examples 1-6 and Comparative Examples 1-12, the evaluation of the maximum bubble content rate (Vol %), the average density of the number of open bubbles (number/cm$^2$), the average density of the number of brown rings (number/cm$^2$), the average brown ring diameter (mm), and the yield of single crystal (%) was performed as follows. These results are listed in Table 4.

Maximum Bubble Content Rate:

The maximum bubble content rate was obtained by the volume of the bubbles occupying in unit volume of the crucible. The bubble content rate of the point having the highest value among the measured points was the maximum bubble content rate.

Average Density of the Number of Open Bubbles:

The average density of the number of open bubbles was calculated by counting, after performing the pulling of silicon single crystal, the number of open bubbles per unit area formed in the inner surface of the vitreous silica crucible, by microscope observation.

Average Density of the Number of Brown Rings:

The average density of the number of brown rings was calculated by counting, after performing the pulling of silicon single crystal, the number of the brown rings per unit area formed in the inner surface of the vitreous silica crucible, by microscope observation.

Average Brown Ring Diameter:

The average brown ring diameter was calculated by measuring the diameters of brown rings per 100 from the straight body portion, the bottom portion, and the corner portion extending from the straight body portion to the bottom portion of the vitreous silica crucible, and by calculating the average value.

The Yield of Single Crystal:

The yield of single crystal was obtained as the weight ratio of the silicon crystal relative to silicon raw material.

TABLE 4

| | The maximum bubble content rate (Vol %) | Average open bubble number density (number/cm$^2$) | Average brown ring number density (number/cm$^2$) | Average brown ring diameter (mm) | Yield of single crystal (%) |
|---|---|---|---|---|---|
| Example 1 | 0.011 | 4.2 | 3.0 | 2.3 | 93 |
| Example 2 | 0.010 | 4.0 | 2.6 | 2.4 | 91 |
| Example 3 | 0.009 | 4.5 | 3.1 | 2.5 | 94 |
| Example 4 | 0.027 | 5.8 | 4.8 | 3.5 | 88 |
| Example 5 | 0.023 | 5.9 | 5.0 | 3.7 | 86 |
| Example 6 | 0.039 | 6.4 | 5.8 | 4.0 | 82 |
| Comparative Example 1 | 0.88 | 28.2 | 21.0 | 5.1 | 58 |
| Comparative Example 2 | 0.77 | 38.5 | 24.2 | 5.7 | 69 |
| Comparative Example 3 | 0.85 | 29.6 | 20.3 | 5.2 | 59 |
| Comparative Example 4 | 0.62 | 59.7 | 29.8 | 6.0 | 70 |
| Comparative Example 5 | 0.59 | 60.3 | 29.1 | 6.1 | 69 |
| Comparative Example 6 | 0.66 | 58.9 | 29.7 | 6.1 | 64 |
| Comparative Example 7 | 1.21 | 66.3 | 30.2 | 6.3 | 66 |
| Comparative Example 8 | 1.38 | 30.5 | 20.8 | 5.1 | 57 |
| Comparative Example 9 | 1.23 | 31.2 | 21.5 | 5.6 | 59 |
| Comparative Example 10 | 1.50 | 67.4 | 29.8 | 6.1 | 63 |
| Comparative Example 11 | 1.32 | 57.9 | 29.9 | 6.4 | 64 |
| Comparative Example 12 | 1.56 | 55.6 | 28.7 | 6.0 | 59 |

From Table 1 and Table 4, when the vitreous silica crucibles of Examples 1-6 having an intensity ratio R of $0.8 \leq R \leq 1.0$ were used, the yield of single crystal was good. Especially for the vitreous silica crucibles of Examples 1-3 manufactured by using the synthetic silica powder of Manufacture Examples 1-3 having an average particle diameter of 87-160 µm, a specific surface area of 0.026-0.045 (m$^2$/g), a tapped bulk density of 1.35-1.44 (g/cm$^3$), and a circularity of 0.73-0.91, the yield of single crystal exceeded 90%. Moreover, when the vitreous silica crucibles of Examples 1-6 after the pulling of silicon single crystal are compared with the vitreous silica crucibles of Comparative Examples 1-12, the average density of the number of open bubbles, the average density of the number of brown rings, and the average brown ring diameter were lower; especially, the crucibles of Examples 1-3 had an average density of the number of open bubbles of 4.0-4.5 (number/cm$^2$), an average density of the number of brown rings of 2.6-3.1 (number/cm$^2$), and an average brown ring diameter of 2.3-2.5 (mm), which diminished significantly. Therefore, for the vitreous silica crucibles of Examples 1-6, the generation of bubbles or brown rings during the pulling of silicon single crystal was reduced, yield of single crystal was good, and in particular, for Examples 1-3, yield of single crystals was significantly good.

Reference Example 5: Pulling of Silicon Single Crystal

The vitreous silica crucibles of Examples 1-3, Comparative Examples 1-3, and Comparative Examples 13-18 were used to perform the pulling of silicon single crystal, and the crucibles after the pulling were observed. The results are shown in Table 5. The vitreous silica crucibles of Examples 1-3 maintained a good shape and inward sagging or buckling was not found. As for Comparative Examples 13-15, inward sagging or buckling occurred in the shape of the entire crucible. Moreover, as for Comparative Examples 16-18, cracks or inward sagging occurred in the rim. Therefore, it is known that when the change of stress from compressive stress to tensile stress was abrupt or too gradual, cracks or inward sagging and buckling occurred in the vitreous silica crucible.

TABLE 5

| | Example | | | Comparative Example | | | | | | | | |
|---|---|---|---|---|---|---|---|---|---|---|---|---|
| | 1 | 2 | 3 | 1 | 2 | 3 | 13 | 14 | 15 | 16 | 17 | 18 |
| State of the crucible after pulling of silicon Single crystal | good | good | good | a number of cracks in the rim | inward sagging in the rim | inward sagging in the rim | inward sagging in the entire crucible | buckling of the crucible | buckling of the crucible | slight inward sagging in the rim | Cracks in the rim | inward sagging in the rim |

What is claimed is:

1. A vitreous silica crucible for pulling of silicon single crystal, comprising: a substantially cylindrical straight body portion having an opening on the top end and extending in a vertical direction, a curved bottom portion, and a corner portion connecting the straight body portion with the bottom portion and a curvature of which is larger than that of the bottom portion, wherein,
the vitreous silica crucible comprises a transparent layer on the inside and a bubble layer on the outside thereof,
a compressive stress layer in which compressive stress remains in the inner surface side of the transparent layer, and
a tensile stress layer in which tensile stress remains and is adjacent to the compressive stress layer at a gradual rate of change of stress, which gradual rate of change of stress is 0.17 MPa/mm or more and 1.5 MPa/mm or less.

2. A method for manufacturing a silica glass crucible for pulling of silicon single crystal, wherein the vitreous silica crucible for pulling of silicon single crystal comprises: a substantially cylindrical straight body portion having an opening on the top end and extending in a vertical direction, a curved bottom portion, and a corner portion connecting the straight body portion with the bottom portion and a curvature of which is larger than that of the bottom portion, wherein, the vitreous silica crucible comprises a transparent layer on the inside and a bubble layer on the outside thereof, a compressive stress layer in which compressive stress remains in the inner surface side of the transparent layer, and a tensile stress layer in which tensile stress remains and is adjacent to the compressive stress layer, comprising:
a process of supplying natural silica powder to a rotating mold for manufacturing vitreous silica crucible and forming a layer of the natural silica powder on the inner surface of the rotating mold for manufacturing vitreous silica crucible,
a process of depositing synthetic silica powder which satisfies following Formula (1) obtained by Raman measurement method on the inside of the layer of the natural silica powder, and
a process of arc discharging in the natural silica powder and the synthetic silica powder, $$0.8 \leq R \leq 1.0 \tag{1}$$

in formula (1), intensity ratio $R=(I_1+I_2)/I_0$
$I_1$=peak intensity of Raman shift 492 cm$^{-1}$ band
$I_2$=peak intensity of Raman shift 606 cm$^{-1}$ band
$I_0$=peak intensity of Raman shift 800 cm$^{-1}$ band.

3. The method of manufacturing a vitreous silica crucible for pulling of silicon single crystal according to claim 2, further comprising a process of introducing a cooling gas into the mold after the arc discharge.

4. The method of manufacturing a vitreous silica crucible for pulling of silicon single crystal according to claim 2, wherein the circularity of the synthetic silica powder is preferably 0.73 or more and 1.0 or less.

5. The method of manufacturing a vitreous silica crucible for pulling of silicon single crystal according to claim 2, the synthetic silica powder has an average particle diameter of 80 μm or more and 160 μm or less, the tapped bulk density is 1.35 g/cm$^3$ or more and 1.44 g/cm$^3$ or less, and the specific surface area is 0.026 m$^2$/g or more and 0.045 m$^2$/g or less.

6. The method of manufacturing a vitreous silica crucible for pulling of silicon single crystal according to claim 3, wherein the circularity of the synthetic silica powder is preferably 0.73 or more and 1.0 or less.

7. The method of manufacturing a vitreous silica crucible for pulling of silicon single crystal according to claim 4, the synthetic silica powder has an average particle diameter of 80 μm or more and 160 μm or less, the tapped bulk density is 1.35 g/cm$^3$ or more and 1.44 g/cm$^3$ or less, and the specific surface area is 0.026 m$^2$/g or more and 0.045 m$^2$/g or less.

* * * * *